(12) United States Patent
Takeshita

(10) Patent No.: US 9,104,119 B2
(45) Date of Patent: *Aug. 11, 2015

(54) EXPOSURE APPARATUS AND DEVICE FABRICATION METHOD FOR REDUCING A CHANGE IN ABERRATION DUE TO DRIVING ERROR

(71) Applicant: CANON KABUSHIKI KAISHA, Tokyo (JP)

(72) Inventor: Bunsuke Takeshita, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/151,652

(22) Filed: Jan. 9, 2014

(65) Prior Publication Data

US 2014/0125960 A1 May 8, 2014

Related U.S. Application Data

(63) Continuation of application No. 12/262,368, filed on Oct. 31, 2008, now Pat. No. 8,659,740.

(30) Foreign Application Priority Data

Nov. 5, 2007 (JP) .................................. 2007-287849

(51) Int. Cl.
*G03F 7/20* (2006.01)
*G03B 27/54* (2006.01)

(52) U.S. Cl.
CPC ................ *G03F 7/706* (2013.01); *G03B 27/54* (2013.01); *G03F 7/70258* (2013.01)

(58) Field of Classification Search
CPC ............ G03F 7/70258; G03F 7/70216; G03F 7/0241; G03F 7/70266
USPC ......................................... 355/39, 52, 55, 77
See application file for complete search history.

(56) References Cited

U.S. PATENT DOCUMENTS 7,830,611 B2 * 11/2010 Conradi et al. ................ 359/665
2006/0209436 A1 * 9/2006 Onuki et al. ................... 359/822

* cited by examiner

*Primary Examiner* — Peter B Kim
*Assistant Examiner* — Michelle Iacoletti
(74) *Attorney, Agent, or Firm* — Canon USA, Inc. IP Division

(57) ABSTRACT

The present invention provides an exposure apparatus comprising a projection optical system configured to project a pattern of a reticle onto a substrate, a driving unit configured to drive a plurality of optical elements which form the projection optical system so as to adjust an imaging state of light which passes through the projection optical system, a detecting unit configured to detect a driving error when the driving unit drives a first optical element of the plurality of optical elements, and a control unit configured to control the driving unit to drive a second optical element different from the first optical element of the plurality of optical elements so as to reduce a change in the imaging state of the light which passes through the projection optical system due to the driving error.

10 Claims, 3 Drawing Sheets

FIG. 3A
FIG. 3B
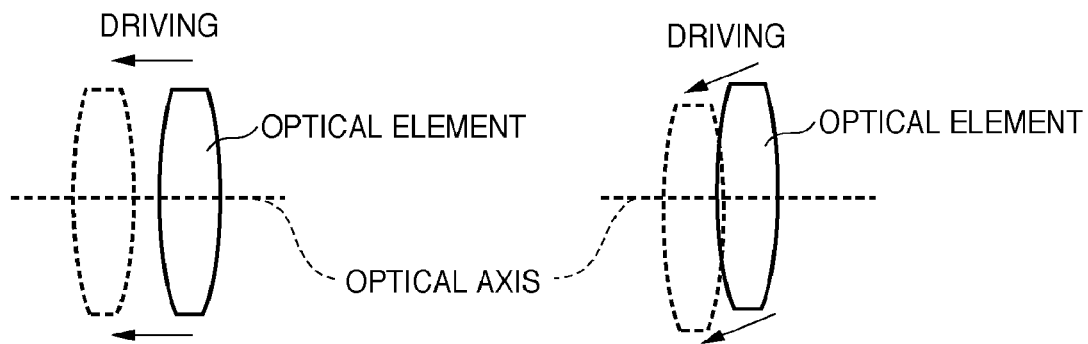
FIG. 4A
FIG. 4B
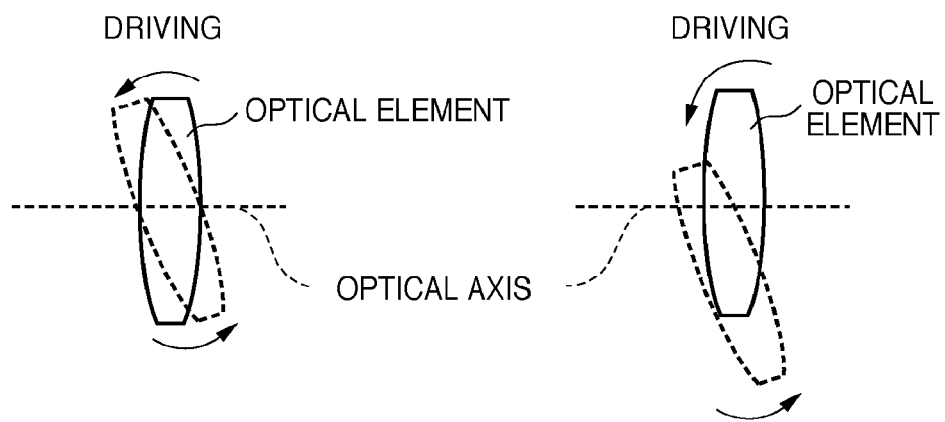

EXPOSURE APPARATUS AND DEVICE FABRICATION METHOD FOR REDUCING A CHANGE IN ABERRATION DUE TO DRIVING ERROR

CROSS-REFERENCE TO RELATED APPLICATION

This application is a Continuation of U.S. application Ser. No. 12/262,368, filed Oct. 31, 2008, which claims priority from Japanese Patent Application No. 2007-287849 filed on Nov. 5, 2007, which is hereby incorporated by reference herein in its entirety.

BACKGROUND OF THE INVENTION

1. Field of the Invention

The present invention relates to an exposure apparatus and a device fabrication method.

2. Description of the Related Art

A projection exposure apparatus has conventionally been employed to fabricate a micropatterned semiconductor device such as a semiconductor memory or logic circuit or a liquid crystal device by using photolithography. The projection exposure apparatus projects and transfers a pattern (including a plurality of different types of patterns) formed on a reticle (mask) onto a substrate such as a wafer via a projection optical system.

Along with the recent increase in the packing density of semiconductor devices, it is becoming indispensable to reduce the aberrations and distortion of the projection optical system in order to transfer a pattern having a high packing density onto a substrate with high accuracy. Note that the aberrations of the projection optical system include not only aberrations in design values but also aberrations due to, for example, fabrication errors at the fabrication stage, those due to the environment (ambient pressure and temperature) in which the exposure apparatus is installed, those which change over time, and those due to exposure heat.

Under these circumstances, Japanese Patent Laid-Open Nos. 2000-357651, 2004-347821, and 2006-113414 propose techniques for reducing (correcting) aberrations and distortion in projection optical systems. For example, Japanese Patent Laid-Open No. 2000-357651 discloses a technique of correcting, for example, magnification aberration, third-order distortion, spherical aberration, and field curvature by driving an optical element which forms the projection optical system or the reticle in the optical axis direction of the projection optical system. Japanese Patent Laid-Open No. 2004-347821 discloses a technique of correcting, for example, decentering distortion, on-axis coma, and local defocus astigmatism by tilting an optical element which forms the projection optical system or the reticle with respect to a plane perpendicular to the optical axis of the projection optical system. Japanese Patent Laid-Open No. 2006-113414 discloses a technique of correcting the imaging performance of the projection optical system by deforming the shape of an optical element which forms the projection optical system.

Unfortunately, unintended aberrations often occur in the prior art due to a driving error when driving the optical element or reticle. This makes it impossible to sufficiently reduce (correct) the aberrations and distortion of the projection optical system.

For example, when the optical element (or reticle) is driven in the optical axis direction of the projection optical system, only aberrations symmetrical about the optical axis, such as magnification aberration, third-order distortion, spherical aberration, and field curvature, are supposed to change as long as there is no driving error, as shown in FIG. 3A. However, in practice, it is difficult to drive the optical element exactly in the optical axis direction, so the optical element is often driven obliquely with respect to the optical axis, as shown in FIG. 3B. In this case, aberrations asymmetrical about the optical axis, such as decentering distortion, on-axis coma, and local defocus astigmatism, change despite the user's intention.

Also, when the optical element (or reticle) is tilted with respect to a plane perpendicular to the optical axis of the projection optical system, aberrations asymmetrical about the optical axis, such as decentering distortion, on-axis coma, local defocus astigmatism, can be corrected to target values as long as there is no driving error, as shown in FIG. 4A. However, in practice, the optical element is slightly, parallelly driven in a direction perpendicular to the optical axis, as shown in FIG. 4B, resulting in deviations of the aberrations asymmetrical about the optical axis from their target values.

SUMMARY OF THE INVENTION

The present invention provides an exposure apparatus which achieves excellent imaging characteristics by adjusting the imaging state (for example, the aberrations) of light which passes through a projection optical system with high accuracy.

According to the first aspect of the present invention, there is provided an exposure apparatus comprising a projection optical system configured to project a pattern of a reticle onto a substrate, a driving unit configured to drive a plurality of optical elements which form the projection optical system so as to adjust an imaging state of light which passes through the projection optical system, a detecting unit configured to detect a driving error when the driving unit drives a first optical element of the plurality of optical elements; and a control unit configured to control the driving unit to drive a second optical element different from the first optical element of the plurality of optical elements so as to reduce a change in the imaging state of the light which passes through the projection optical system due to the driving error.

According to the second aspect of the present invention, there is provided an exposure apparatus comprising a projection optical system configured to project a pattern of a reticle onto a substrate, a driving unit configured to drive a plurality of optical elements which form the projection optical system so as to adjust an imaging state of light which passes through the projection optical system, and a control unit configured to control the driving unit to drive a second optical element different from a first optical element of the plurality of optical elements so as to reduce a change in the imaging state of the light which passes through the projection optical system due to a driving error upon driving the first optical element of the plurality of optical elements.

According to the third aspect of the present invention, there is provided a device fabrication method comprising steps of exposing a substrate using an exposure apparatus, and performing a development process for the substrate exposed, wherein the exposure apparatus includes a projection optical system configured to project a pattern of a reticle onto the substrate, a driving unit configured to drive a plurality of optical elements which form the projection optical system so as to adjust an imaging state of light which passes through the projection optical system, a detecting unit configured to detect a driving error when the driving unit drives a first optical element of the plurality of optical elements, and a control unit configured to control the driving unit to drive a second optical element different from the first optical element of the plurality of optical elements so as to reduce a change in the imaging state of the light which passes through the projection optical system due to the driving error.

According to the fourth aspect of the present invention, there is provided a device fabrication method comprising steps of exposing a substrate using an exposure apparatus, and performing a development process for the substrate exposed, wherein the exposure apparatus includes a projection optical system configured to project a pattern of a reticle onto the substrate, a driving unit configured to drive a plurality of optical elements which form the projection optical system so as to adjust an imaging state of light which passes through the projection optical system, and a control unit configured to control the driving unit to drive a second optical element different from a first optical element of the plurality of optical elements so as to reduce a change in the imaging state of the light which passes through the projection optical system due to a driving error upon driving the first optical element of the plurality of optical elements.

Further features of the present invention will become apparent from the following description of exemplary embodiments with reference to the attached drawings.

BRIEF DESCRIPTION OF THE DRAWINGS

FIGS. 3A and 3B are diagrams for explaining a change in the aberration of a projection optical system due to a driving error when an optical element (or reticle) is driven in the optical axis direction of the projection optical system.

FIGS. 4A and 4B are diagrams for explaining a change in the aberration of a projection optical system due to a driving error when an optical element (or reticle) is tilted with respect to a plane perpendicular to the optical axis of the projection optical system.

DESCRIPTION OF THE EMBODIMENT

Figure 1:
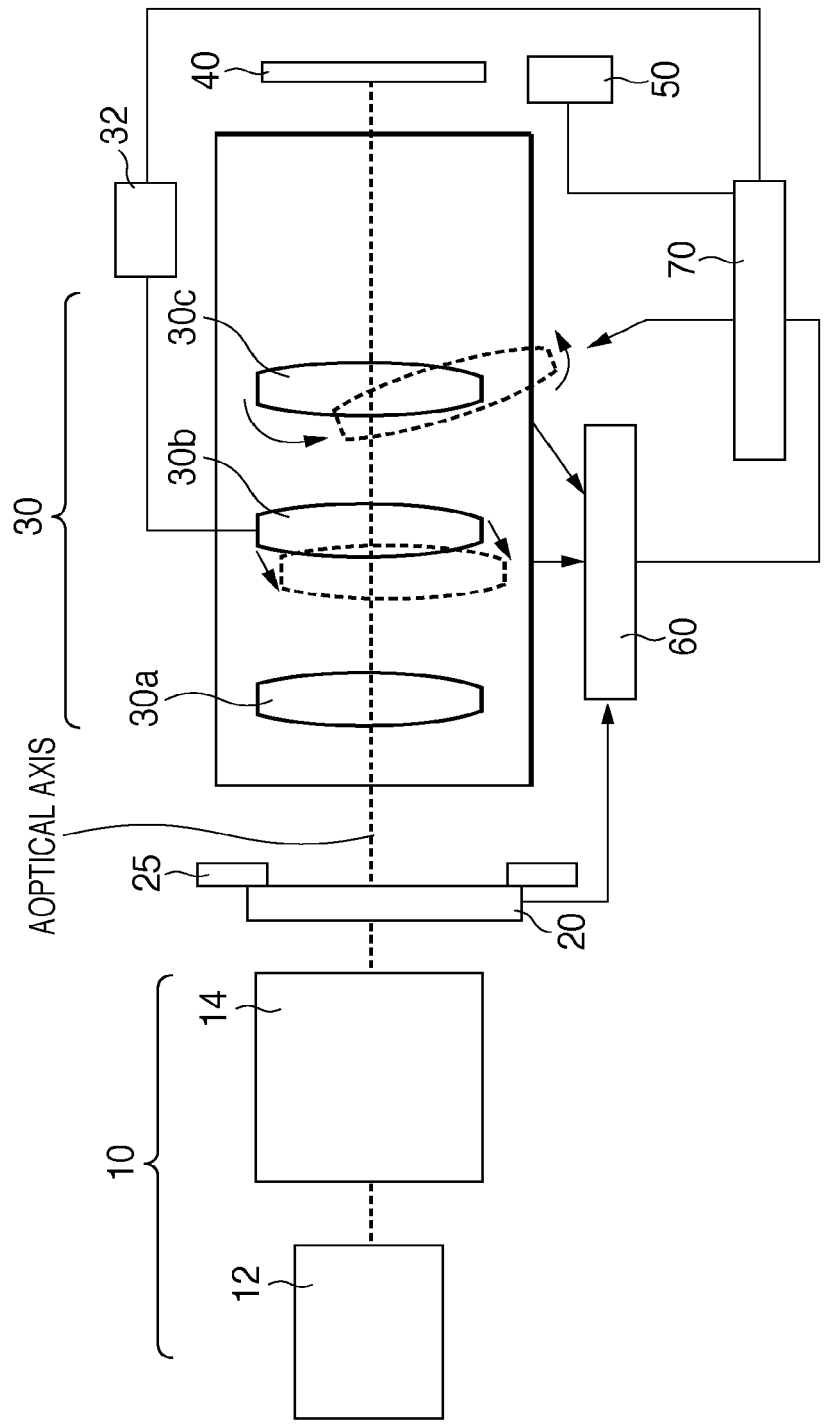
FIG. 1 is a schematic block diagram showing an exposure apparatus according to one aspect of the present invention.

A preferred embodiment of the present invention will be described below with reference to the accompanying drawings. The same reference numerals denote the same members throughout the drawings, and a repetitive description thereof will not be given.

FIG. 1 is a schematic block diagram showing the arrangement of an exposure apparatus 1 according to one aspect of the present invention. In this embodiment, the exposure apparatus 1 is a projection exposure apparatus which transfers the pattern of a reticle 20 onto a wafer 40 by the step & scan scheme. However, the exposure apparatus 1 can adopt the step & repeat scheme or another exposure scheme.

The exposure apparatus 1 includes an illumination apparatus 10, a reticle stage 25 for mounting the reticle 20, a projection optical system 30, a wafer stage (not shown) for mounting the wafer 40, a measuring unit 50, a detecting unit 60, and a control unit 70.

The illumination apparatus 10 illuminates the reticle 20 on which a pattern to be transferred is formed, and includes a light source 12 and illumination optical system 14.

The light source 12 is, for example, an ArF excimer laser having a wavelength of about 193 nm or a KrF excimer laser having a wavelength of about 248 nm. However, the light source 12 is not particularly limited to an excimer laser and may be, for example, an $F_2$ laser or superhigh pressure mercury lamp, and the number of light sources 12 is also not particularly limited.

The illumination optical system 14 illuminates the reticle 20 with a uniform illuminance distribution under a predetermined illumination condition using light from the light source 12, and includes, for example, a lens, mirror, optical integrator, and stop.

The reticle 20 has a pattern to be transferred and is supported and driven by the reticle stage 25. Diffracted light generated by the reticle 20 is projected onto the wafer 40 via the projection optical system 30. The reticle 20 and wafer 40 are set to have an optically conjugate relationship. Since the exposure apparatus 1 is of the step & scan scheme, it transfers the pattern of the reticle 20 onto the wafer 40 by scanning them.

The reticle stage 25 supports the reticle 20 and drives it using, for example, a linear motor. More specifically, the reticle stage 25 drives the reticle 20 in the optical axis direction of the projection optical system 30, a direction perpendicular to the optical axis of the projection optical system 30, and the rotation direction about the optical axis. The reticle stage 25 may also drive the reticle 20 under the control of the control unit 70 so as to adjust the imaging state (e.g., decentering distortion, on-axis coma, and local defocus astigmatism) of the light which passes through the projection optical system 30. More specifically, the reticle stage 25 tilts the reticle 20 with respect to a plane perpendicular to the optical axis of the projection optical system 30 or drives the reticle 20 in the optical axis direction of the projection optical system 30. With this operation, the imaging state of the light which passes through the projection optical system 30 is adjusted, and the projection optical system 30 can thus achieve desired imaging characteristics.

The projection optical system 30 includes a plurality of optical elements 30a to 30c and projects the pattern of the reticle 20 onto the wafer 40. Also, the projection optical system 30 includes a driving unit 32 for driving the plurality of optical elements 30a to 30c. Although the plurality of optical elements 30a to 30c are lenses in this embodiment, they may be, for example, mirrors.

The driving unit 32 drives the optical elements 30b and 30a under the control of the control unit 70. More specifically, the driving unit 32 drives the optical element 30b in the optical axis direction of the projection optical system 30, thereby adjusting aberrations symmetrical about the optical axis, such as magnification aberration, third-order distortion, spherical aberration, and field curvature. Also, the driving unit 32 tilts the optical element 30c with respect to a plane perpendicular to the optical axis of the projection optical system 30, thereby adjusting aberrations asymmetrical about the optical axis, such as decentering distortion, on-axis coma, and local defocus astigmatism. In this manner, the driving unit 32 can adjust the imaging state of the light which passes through the projection optical system 30 by driving the optical elements 30b and 30c which form the projection optical system 30.

In this embodiment, the driving unit 32 drives the optical element 30b in the optical axis direction of the projection optical system 30, and tilts the optical element 30c with respect to a plane perpendicular to the optical axis of the projection optical system 30. However, the operation of the driving unit 32 is not particularly limited to the above-described driving. For example, the driving unit 32 may drive the optical element 30a, or may drive the optical elements 30b and 30c in the optical axis direction of the projection optical system 30 and tilt them with respect to a plane perpendicular to the optical axis of the projection optical system 30 at the same time.

The wafer 40 is a substrate onto which the pattern of the reticle 20 is projected (transferred), and is supported and driven by the wafer stage (not shown). However, it is also possible to use a glass plate or another substrate in place of the wafer 40. The wafer 40 is coated with a resist.

The measuring unit 50 measures the aberrations (aberrations symmetrical about the optical axis, such as magnification aberration, third-order distortion, spherical aberration, and field curvature, and those asymmetrical about the optical axis, such as decentering distortion, on-axis coma, and local defocus astigmatism) of the projection optical system 30 as its imaging characteristics. The measuring unit 50 measures the aberrations of the projection optical system 30 using, for example, a point diffraction interferometer (PDI), line diffraction interferometer (LDI), or shearing interferometer. The measuring unit 50 sends the measurement result (i.e., the aberrations of the projection optical system 30) to the control unit 70.

The detecting unit 60 detects a driving error when the reticle stage 25 drives the reticle 20 or when the driving unit 32 drives the optical elements 30b and 30c. The detecting unit 60 sends the detection result (i.e., the driving error or errors) to the control unit 70.

Note that when the reticle stage 25 drives the reticle 20, the driving error is a shift between a desired position to which the reticle 20 is driven and aligned and a position to which it is actually driven. For example, when the reticle 20 is driven in the optical axis direction of the projection optical system 30, it is often driven obliquely with respect to the optical axis. The amount of unintended oblique driving as in this case translates into a driving error. Likewise, when the reticle 20 is tilted with respect to a plane perpendicular to the optical axis of the projection optical system 30, it is often parallelly driven in a direction perpendicular to the optical axis. The amount of unintended parallel driving as in this case translates into a driving error.

Also, when the driving unit 32 drives the optical elements 30b and 30c, the driving errors are shifts between desired positions to which the optical elements 30b and 30c are driven and aligned and positions to which they are actually driven. For example, when the optical element 30b is driven in the optical axis direction of the projection optical system 30, it is often driven obliquely with respect to the optical axis. The amount of unintended oblique driving as in this case translates into a driving error. If the optical element 30b can move only in the optical axis direction, the amount of oblique driving cannot be corrected using the optical element 30b itself. Likewise, when the optical element 30c is tilted with respect to a plane perpendicular to the optical axis of the projection optical system 30, it is often parallelly driven in a direction perpendicular to the optical axis. The amount of unintended parallel driving as in this case translates into a driving error. If the optical element 30c can only be tilted, the amount of parallel driving cannot be corrected using the optical element 30c itself.

The exposure apparatus 1 according to this embodiment reduces the aberrations of the projection optical system 30 due to a driving error of a first optical element of a plurality of optical elements which form the projection optical system 30 by driving a second optical element different from the first optical element as well.

The detecting unit 60 may directly detect a driving error or errors by measuring, for example, the position of the reticle 20 driven by the reticle stage 25 or those of the optical elements 30b and 30c driven by the driving unit 32. An apparatus which measures the position of the reticle 20 or those of the optical elements 30b and 30c can take any form known to those skilled in the art.

The detecting unit 60 may have, in advance, information representing the relationship between the driving amount of the reticle 20 or those of the optical elements 30b and 30c and the driving error or errors, and detect the driving error or errors by measuring the driving amount of the reticle 20 or those of the optical elements 30b and 30c.

The control unit 70 includes a CPU and memory and controls the operation of the exposure apparatus 1. In this embodiment, the control unit 70 calculates the driving amount of the reticle 20 or those of the optical elements 30b and 30c to correct the aberrations of the projection optical system 30 or adjust them to their target values, based on the measurement result obtained by the measuring unit 50. Also, the control unit 70 controls the reticle stage 25 or driving unit 32 so as to reduce a change in the imaging state of the light which passes through the projection optical system 30 due to a driving error or errors when driving the reticle 20 or optical elements 30b and 30c. The detailed operation of the control unit 70 will be explained in an explanation of the operation of the exposure apparatus 1.

Figure 2:
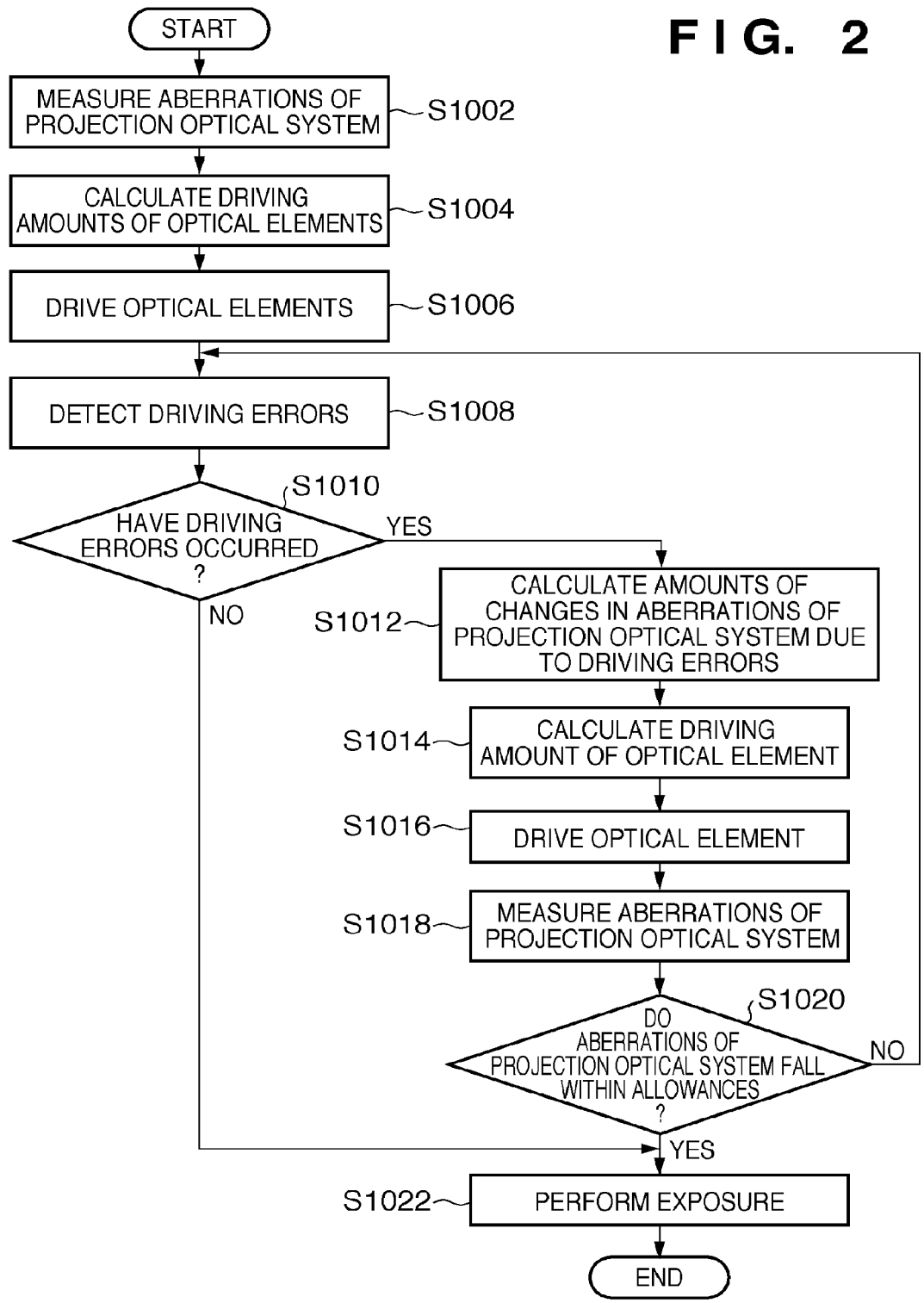
FIG. 2 is a flowchart for explaining the operation of the exposure apparatus shown in FIG. 1.

The operation of the exposure apparatus 1 will be explained below with reference to FIG. 2. FIG. 2 is a flowchart for explaining the operation of the exposure apparatus 1. This embodiment will exemplify a case in which only the optical elements 30b and 30c which form the projection optical system 30 are driven in adjusting (correcting) the imaging state of the light which passes through the projection optical system 30. However, the imaging state of the light which passes through the projection optical system 30 may be adjusted (corrected) by driving the reticle 20. Alternatively, the imaging state of the light which passes through the projection optical system 30 may be adjusted (corrected) by combining the driving of the reticle 20 and that of the optical elements 30b and 30c.

First, the measuring unit 50 measures the aberrations of the projection optical system 30 as its imaging characteristics (step S1002), and sends the measurement result to the control unit 70.

Next, the control unit 70 calculates the driving amounts of the optical elements 30b and 30c, which are necessary to correct the aberrations of the projection optical system 30 or adjust them to their target values, based on the measurement result sent from the measuring unit 50 (step S1004). More specifically, the control unit 70 divides the aberrations of the projection optical system 30 measured by the measuring unit 50 into those symmetrical about the optical axis of the projection optical system 30 and those asymmetrical about the optical axis of the projection optical system 30. The control unit 70 then calculates the driving amount of the optical element 30b (the driving amount by which the optical element 30b is driven in the optical axis direction of the projection optical system 30), which is necessary to correct the aberrations symmetrical about the optical axis of the projection optical system 30 or adjust them to their target values. Likewise, the control unit 70 calculates the driving amount of the optical element 30c (the tilt amount by which the optical element 30c is tilted with respect to a plane perpendicular to the optical axis of the projection optical system 30), which is necessary to correct the aberrations asymmetrical about the optical axis of the projection optical system 30 or adjust them to their target values. The control unit 70 may have, in advance in a memory or the like, information representing the relationship between the aberrations of the projection optical system 30 and the driving amounts of the optical elements 30b and 30c, which are necessary to correct the aberrations or adjust them to their target values. In this case, a comparison between the information and the aberrations of the projection optical system 30 measured by the measuring unit 50 makes it possible to obtain the driving amounts of the optical elements 30b and 30c, which are necessary to correct the aberrations of the projection optical system 30 or adjust them to their target values.

The control unit 70 controls the driving unit 32 to drive the optical elements 30b and 30c based on the driving amounts calculated in step S1004 (step S1006).

The execution of steps S1002 to S1006 is supposed to correct the aberrations of the projection optical system 30 or adjust them to their target values. However, as described above, when the optical elements 30b and 30c are driven actually, driving errors often occur, resulting in insufficient correction of the aberrations of the projection optical system 30 or in deviations of the aberrations of the projection optical system 30 from their target values.

To avoid this situation, the detecting unit 60 detects driving errors upon driving the optical elements 30b and 30c (step S1008), and sends the detection result to the control unit 70.

The control unit 70 checks whether driving errors have occurred, based on the detection result from the detecting unit 60 (step S1010).

If no driving errors have occurred, the control unit 70 controls each unit of the exposure apparatus 1 to transfer the pattern of the reticle 20 onto the wafer 40 by exposure (step S1022).

If driving errors have occurred, the control unit 70 calculates the amounts of changes in the aberrations of the projection optical system 30 due to the driving errors detected by the detecting unit 60 (step S1012). Note that the amounts of changes in the aberrations of the projection optical system 30 due to the driving errors are differences between the aberrations of the projection optical system 30 after driving the optical elements 30b and 30c and their target values.

The control unit 70 calculates the driving amount of the optical element 30c, which is necessary to reduce (cancel) the amounts of changes in the aberrations of the projection optical system 30 due to the driving errors calculated in step S1012 (step S1014). For example, the control unit 70 has, in advance in a memory or the like, information representing the relationship between the amounts of changes in the aberrations of the projection optical system 30 due to the driving errors and the driving amount of the optical element 30c, which is necessary to reduce (cancel) the amounts of changes. The control unit 70 then compares the information, the driving errors, and the amounts of changes in the aberrations of the projection optical system 30 due to the driving errors, thereby calculating the driving amount of the optical element 30c. Alternatively, the control unit 70 may have, in advance in a memory or the like, information representing the relationship between the driving error amounts of the optical elements 30b and 30c detected by the detecting unit 60 and the driving amount of the optical element 30c, which is necessary to cancel changes in the aberrations of the projection optical system 30 due to these driving error amounts. The control unit 70 then compares the information and the driving error of the optical element 30c, thereby calculating the driving amount of the optical element 30c. Note that in this embodiment, only the driving amount of the optical element 30c is calculated assuming that aberrations which change due to the driving errors are only aberrations asymmetrical about the optical axis of the projection optical system 30. However, when aberrations symmetrical about the optical axis of the projection optical system 30 also change due to the driving errors, the driving amount of the optical element 30b is calculated as well. When there are a plurality of optical elements 30c (optical elements 30c1 and 30c2), a driving error of the optical element 30c1 may be corrected by the optical element 30c2 or the optical elements 30c1 and 30c2.

The control unit 70 controls the driving unit 32 to drive the optical element 30c based on the driving amount calculated in step S1014 (step S1016).

The measuring unit 50 measures the aberrations of the projection optical system 30 (step S1018), and sends the measurement result to the control unit 70.

The control unit 70 checks whether the aberrations of the projection optical system 30 fall within allowances (step S1020).

If the aberrations of the projection optical system 30 fall outside the allowances, a driving error has occurred even when driving the optical element 30c in step S1016, so the process returns to step S1008.

If the aberrations of the projection optical system 30 fall within the allowances, the control unit 70 controls each unit of the exposure apparatus 1 to transfer the pattern of the reticle 20 onto the wafer 40 by exposure (step S1022). In the exposure, light from the light source 12 illuminates the reticle 20 via the illumination optical system 14. The light which bears the information of the pattern of the reticle 20 forms an image on the wafer 40 by the projection optical system 30. The imaging state (aberrations and distortion) of the light which has passed through the projection optical system 30 used for the exposure apparatus 1 is adjusted (corrected) with high accuracy, as described above. In other words, the projection optical system 30 achieves an excellent imaging performance. Hence, the exposure apparatus 1 can provide high-quality devices (e.g., a semiconductor device and liquid crystal device) with a high throughput and a good economical efficiency. These devices are fabricated by a step of exposing a substrate (e.g., a wafer or glass plate) coated with a photoresist (photosensitive agent) using the exposure apparatus 1, a step of developing the exposed substrate, and other known steps.

The exposure apparatus 1 according to this embodiment can correct not only the imaging characteristics of the projection optical system 30, which change in the process of its fabrication or use, but also changes in the imaging characteristics of the projection optical system 30 due to driving errors upon driving the optical elements 30b and 30c.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An exposure apparatus comprising:
a projection optical system configured to project a pattern of a reticle onto a substrate;
a driving unit configured to drive a plurality of optical elements which form said projection optical system so as to adjust an aberration of said projection optical system;
a detecting unit configured to detect a driving error when said driving unit drives a first optical element of the plurality of optical elements; and
a control unit configured to control said driving unit to drive a second optical element different from the first optical element of the plurality of optical elements so as to reduce a change in the aberration of said projection optical system due to the driving error, wherein said control unit has information representing a relationship between the driving error and a driving amount of the second optical element, which is necessary to reduce the change in the aberration of said projection optical system due to the driving error, and said control unit controls said driving unit based on the information and the driving error detected by said detecting unit.

2. The apparatus according to claim 1, wherein said driving unit drives the first optical element and the second optical element in different ways.

3. The apparatus according to claim 2, wherein the driving of the first optical element by said driving unit is deformation of the first optical element and the driving of the second optical element by said driving unit is one of tilting with respect to a plane perpendicular to an optical axis of said projection optical system and driving in a direction of the optical axis of said projection optical system.

4. The apparatus according to claim 1, wherein said control unit controls said driving unit to drive the first optical element and the second optical element of the plurality of optical elements so as to reduce the change in the aberration of said projection optical system due to the driving error upon driving the first optical element.

5. An exposure apparatus comprising:
a projection optical system configured to project a pattern of a reticle onto a substrate;
a driving unit configured to drive a plurality of optical elements which form said projection optical system so as to adjust an aberration of said projection optical system; and
a control unit configured to control said driving unit to drive a second optical element different from a first optical element of the plurality of optical elements so as to reduce a change in the aberration of said projection optical system due to a driving error upon driving the first optical element of the plurality of optical elements,
wherein said control unit has information representing a relationship between a driving amount of the first optical element and a driving amount of the second optical element, which is necessary to reduce the change in the aberration of said projection optical system due to the driving error upon driving the first optical element by the driving amount of the first optical element, and
said control unit controls said driving unit based on the information and the driving amount of the first optical element.

6. The apparatus according to claim 5, wherein said driving unit drives the first optical element and the second optical element in different ways.

7. The apparatus according to claim 6, wherein the driving of the first optical element by said driving unit is deformation of the first optical element and the driving of second optical element by said driving unit is one of tilting with respect to a plane perpendicular to an optical axis of said projection optical system and driving in a direction of the optical axis of said projection optical system.

8. The apparatus according to claim 5, wherein said control unit controls said driving unit to drive the first optical element and the second optical element of the plurality of optical elements so as to reduce the change in aberration of said projection optical system due to the driving error upon driving the first optical element.

9. A device fabrication method comprising steps of:
exposing a substrate using an exposure apparatus; and
performing a development process for the substrate exposed,
wherein said exposure apparatus includes:
a projection optical system configured to project a pattern of a reticle onto the substrate;
a driving unit configured to drive a plurality of optical elements which form said projection optical system so as to adjust an aberration of said projection optical system;
a detecting unit configured to detect a driving error when said driving unit drives a first optical element of the plurality of optical elements; and
a control unit configured to control said driving unit to drive a second optical element different from the first optical element of the plurality of optical elements so as to reduce a change in the aberration of said projection optical system due to the driving error,
wherein said control unit has information representing a relationship between the driving error and a driving amount of the second optical element, which is necessary to reduce the change in the aberration of said projection optical system due to the driving error, and
said control unit controls said driving unit based on the information and the driving error detected by said detecting unit.

10. A device fabrication method comprising steps of:
exposing a substrate using an exposure apparatus; and
performing a development process for the substrate exposed,
wherein said exposure apparatus includes:
a projection optical system configured to project a pattern of a reticle onto the substrate;
a driving unit configured to drive a plurality of optical elements which form said projection optical system so as to adjust an aberration of said projection optical system; and
a control unit configured to control said driving unit to drive a second optical element different from a first optical element of the plurality of optical elements so as to reduce a change in the aberration of said projection optical system due to a driving error upon driving the first optical element of the plurality of optical elements,
wherein said control unit has information representing a relationship between a driving amount of the first optical element and a driving amount of the second optical element, which is necessary to reduce the change in the aberration of said projection optical system due to the driving error upon driving the first optical element by the driving amount of the first optical element, and
said control unit controls said driving unit based on the information and the driving amount of the first optical element.

* * * * *